US007875469B2

(12) United States Patent
Busta

(10) Patent No.: US 7,875,469 B2
(45) Date of Patent: Jan. 25, 2011

(54) METHOD OF OPERATING AND PROCESS FOR FABRICATING AN ELECTRON SOURCE

(75) Inventor: Heinz H. Busta, Park Ridge, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 53 days.

(21) Appl. No.: 12/001,631

(22) Filed: Dec. 12, 2007

(65) Prior Publication Data

US 2008/0095315 A1 Apr. 24, 2008

Related U.S. Application Data

(62) Division of application No. 10/763,552, filed on Jan. 23, 2004, now Pat. No. 7,317,278.

(60) Provisional application No. 60/444,152, filed on Jan. 31, 2003.

(51) Int. Cl.
*H01L 21/00* (2006.01)

(52) U.S. Cl. .................. 438/20; 438/800; 257/E21.05; 257/E21.395

(58) Field of Classification Search .................. 438/20, 438/40, 343, 344, 800, FOR. 471, FOR. 472; 257/E21.05, E21.394; 445/50, 51; 313/499, 313/506
See application file for complete search history.

(56) References Cited

U.S. PATENT DOCUMENTS

| | | | | |
|---|---|---|---|---|
| 3,665,241 | A | 5/1972 | Spindt et al. | |
| 5,183,783 | A * | 2/1993 | Ohta et al. | 438/404 |
| 5,266,155 | A * | 11/1993 | Gray | 216/18 |
| 5,382,185 | A * | 1/1995 | Gray et al. | 445/49 |
| 5,656,340 | A * | 8/1997 | Ubukata et al. | 428/1.23 |
| 5,665,643 | A * | 9/1997 | Shin | 438/763 |
| 5,772,488 | A * | 6/1998 | Cathey et al. | 445/50 |
| 5,818,153 | A * | 10/1998 | Allen | 313/306 |
| 5,874,808 | A | 2/1999 | Busta et al. | |
| 6,096,570 | A * | 8/2000 | Hattori | 438/20 |
| 6,477,235 | B2 | 11/2002 | Chornenky et al. | |
| 6,616,497 | B1 * | 9/2003 | Choi et al. | 445/24 |
| 2002/0140336 | A1 * | 10/2002 | Stoner et al. | 313/310 |
| 2004/0005030 | A1 | 1/2004 | Busta | |

* cited by examiner

*Primary Examiner*—Matthew S Smith
*Assistant Examiner*—Quovaunda Jefferson
(74) *Attorney, Agent, or Firm*—Thomas E. Omholt; Francis J. Koszyk; Steven D. Weseman

(57) ABSTRACT

A method of operating and process for fabricating an electron source. A conductive rod is covered by an insulating layer, by dipping the rod in an insulation solution, for example. The rod is then covered by a field emitter material to form a layered conductive rod. The rod may also be covered by a second insulating material. Next, the materials are removed from the end of the rod and the insulating layers are recessed with respect to the field emitter layer so that a gap is present between the field emitter layer and the rod. The layered rod may be operated as an electron source within a vacuum tube by applying a positive bias to the rod with respect to the field emitter material and applying a higher positive bias to an anode opposite the rod in the tube. Electrons will accelerate to the charged anode and generate soft X-rays.

9 Claims, 7 Drawing Sheets

METHOD OF OPERATING AND PROCESS FOR FABRICATING AN ELECTRON SOURCE

CROSS-REFERENCE TO RELATED PATENT APPLICATIONS

This application is a divisional of U.S. patent application Ser. No. 10/763,552 filed Jan. 23, 2004 now U.S. Pat. No. 7,317,278 which is a non-provisional of provisional U.S. Patent Application No. 60/444,152 filed on Jan. 31, 2003.

FIELD OF INVENTION

The present invention relates to electron emitters. More specifically, the present invention relates to the fabrication of electron emitters, which may be used as X-ray sources in nanoparticle-based electron guns.

BACKGROUND

In recent years, the field of "vacuum microelectronics" has experienced tremendous growth. Vacuum microelectronics is the science of building devices that operate with electrons that are free to move in a vacuum based on the ballistic movement of the electrons in the vacuum. This enables higher electron energies than are possible with semiconductor structures, so vacuum microelectronic devices can operate at higher frequencies and higher power in a wider temperature range, as well as in high radiation environments. By contrast, solid-state semiconductor microelectronics have carriers (e.g., electrons and holes), which have their movement impaired by interaction with the lattice structure of the semiconductor substrate.

One way of obtaining electrons for vacuum microelectronics devices is by field emission or "cold emission," using a typical Spindt emitter. A Spindt emitter includes a substrate with small cones fabricated into its surface designed to emit electrons from their tips. Alternate geometric configurations such as wedges or "volcano" configurations have also been used. Each cone, or other design, has a concentric aperture etched from the substrate surrounding the cone. This aperture has a conductive gate film deposited on its surface so that an array of cones functions as a field emission source of electrons when a positive potential is applied to the gate relative to the tips of the cones. Once free of the confining tip, the electrons Unfortunately, Spindt emitters are very difficult to fabricate. For example, many issues affect the etching or formation of the cones, or other shapes of the Spindt emitter. Fabrication difficulties include, for instance, forming a cone with a precise tip, uniformity of the cones within an array, spacing between cones of the array, and scaling of the cone forms (i.e., obtaining a 1:1 base diameter-to-cone height ratio).

Another type of emitter that produces electrons is a thin-film edge field emitter. This type of emitter includes a substrate, such as that used as the base of an integrated circuit, in which thin-film layers of material are deposited upon, using a chemical beam deposition ("CBD") process for example, and desired areas are etched out of these layers to form an area where electrons may be extracted. Similar to Spindt emitters, thin-film edge field emitters are difficult to manufacture since precise designs are required, therefore, it is difficult to create these type of emitters with reproducibly designed emitter surfaces. Consequently, an electron source that overcomes these problems is desirable.

SUMMARY

In an exemplary embodiment, a layered conductive rod is provided. The layered conductive rod comprises a central conductive rod having a base and side walls, a first insulating layer covering the side walls, and a field emitter layer covering the first insulating layer. The layered conductive rod may be fabricated by covering at least one end of a conductive rod with a first insulating layer, and thereafter, covering at least a portion of the first insulating layer with a layer of a field emitter material to form a field emitter layer.

In another respect, the exemplary embodiment may take the form of a vacuum tube, which comprises the layered conductive rod positioned in a housing. In addition, a second conductive rod may be positioned in the housing opposite the layered conductive rod. The vacuum tube may be operated by applying a first voltage bias, such as a positive bias for example, to an inner rod of the layered conductive rod with respect to a field emitter layer of the layered conductive rod, and applying a second voltage bias, such as a higher positive bias for example, to the second conductive rod with respect to the field emitter layer in order to accelerate electrons from the field emitter layer to the second conductive rod to generate x-rays.

These as well as other features and advantages will become apparent to those of ordinary skill in the art by reading the following detailed description, with appropriate reference to the accompanying drawings.

BRIEF DESCRIPTION OF DRAWINGS

Exemplary embodiments of the present invention are described with reference to the following drawings, in which.

DETAILED DESCRIPTION OF EXEMPLARY EMBODIMENTS

Figure 1A:
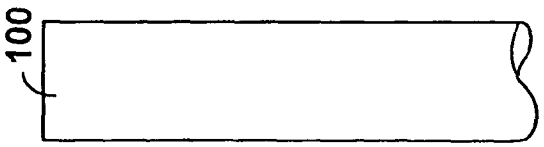
FIGS. 1A-1D illustrate a process of fabricating a layered conductive rod according to an exemplary embodiment of the present invention.

The present invention relates to electron emitters. More specifically, the present invention relates to the fabrication of electron emitters, which may be used as X-ray sources in nanoparticle-based electron guns. In another respect, the present invention provides a process for fabrication of a miniature triode X-ray generator.

Referring now to the drawings, and more particularly to FIGS. 1A-1D, there is illustrated a process of fabricating a layered conductive rod 108 according to an exemplary embodiment of this invention. It should be understood that the process illustrated in FIGS. 1A-1D and other methods and arrangements described herein are set forth for purposes of example only, and other arrangements and elements can be used instead and some elements may be omitted altogether, depending on manufacturing and/or consumer preferences.

By way of example, FIGS. 1A-1D illustrate a process for fabricating a layered conductive rod 108, which may be used as an electron source. FIG. 1A illustrates a conductive rod 100, which is the core of layered conductive rod 108. Conductive rod 100 may be a copper or tungsten rod with an "effective diameter" (referred to here as a width of conductive rod 100 or a distance traversing from opposing sides of conductive rod 100) of about 200 μm to about 1000 μm. Conductive rod 100 also may have a length of about 1 inch to about 2 inches.

In another embodiment, conductive rod 100 may comprise a rod of any material covered with a layer of a conductive material. For example, a glass rod (such as a glass fiber) may be covered with a layer of tungsten or tantalum to form conductive rod 100. The layer may be about 0.1 μm to about 1 μm thick. Other insulating materials may be used as well to form conductive rod 100, as long as they have a layer of conductive material formed on an exterior surface. In addition, rods comprising slightly conductive materials may be covered with a layer of a more conductive material to form conductive rod 100 to improve performance of conductive rod 100.

Figure 1B:
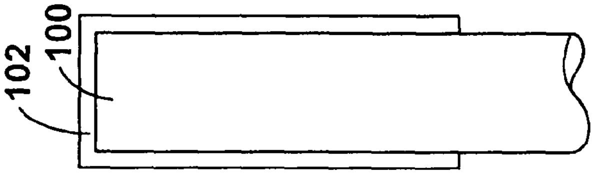

To form layered conductive rod 108, conductive rod 100 is initially covered with a first insulating material 102 to form an insulated conductive rod, as shown in FIG. 1B. The extent to which conductive rod 100 is covered with first insulating material 102 depends on a desired application of layered conductive rod 108. For example, if layered conductive rod 108 is employed as a gated electron source (e.g., can be turned on and off by applying a voltage), then only one end of conductive rod 100 may need to be covered, and possibly only up to about 2 mm in length.

First insulating material 102 may be a non-conductive material such as a spin-on glass material or polymide. The layer of first insulating material 102 may be between about 0.5 μm to about 3 μm or more in thickness depending on a desired application.

After conductive rod 100 is covered with first insulating material 102, conductive rod 100 is allowed to cure to form an insulated conductive rod. For example, if first insulating material 102 is a spin-on glass, the insulated conductive rod is heated to about 400° C. to cure the material. As another example, if first insulating material 102 is polymide, the insulated conductive rod is heated to about 350° C. to cure.

Figure 1C:
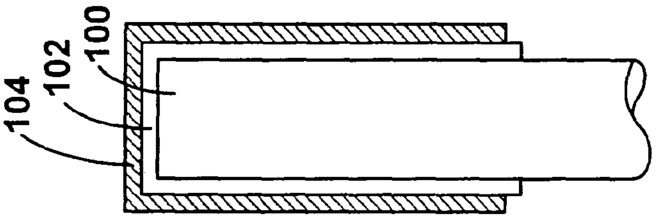

Next, the insulated conductive rod is covered with a field emitter material 104, as illustrated in FIG. 1C. Again, the extent to which the insulated conductive rod is covered with field emitter material 104 depends on a desired application of layered conductive rod 108.

Field emitter material 104 may be carbon-based material. For example, field emitter material 104 may be carbon nanotubes, Vulcan black, or Vulcan black mixed with nanoparticle size silica mixed in spin-on glass or polymide. In addition, these carbon-based materials may be supplied as powders that may be mixed with a photoresist material to obtain field emitter material 104.

The layer of field emitter material 104 may be between about 0.1 μm to about 4 μm thick depending on a desired application. The carbon-based nanoparticles, including nanotubes, can be mixed in a matrix and deposited on the insulated conductive rod, by dipping the insulated rod into the field emitter matrix.

After the insulated conductive rod is covered with field emitter material 104, the rod is allowed to cure. For example, to cure field emitter material 104, the rod may be heated to about 120° C.

Figure 1D:
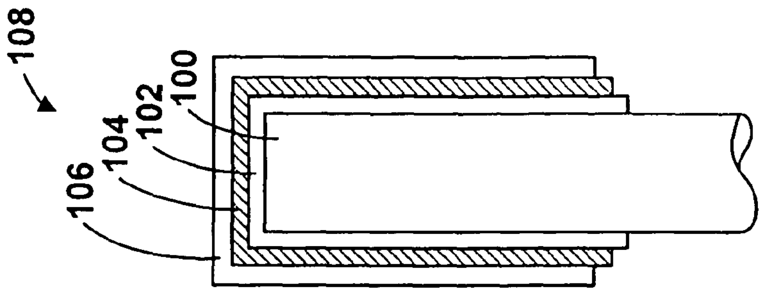

Next, the insulated conductive rod is covered with a second insulating material 106 and allowed to cure to form layered conductive rod 108, as illustrated in FIG. 1D. Second insulating material 106 may be the same as first insulating material 102 or selected from the same class of materials as first insulating material 102. Furthermore, second insulating material 106 may be about 1 μm to about 10 μm thick.

Conductive rod 100 can be covered with the insulating materials and the field emitter material (and possibly initially by a conductive material to enhance performance) by dipping conductive rod 100 into a liquid or fluid form (possible including particles of materials) of the respective materials. Conductive rod 100 is dipped a sufficient length into the liquid to cover a desired length and portion of conductive rod 100. For example, only one end of conductive rod 100 may be dipped because although conductive rod 100 may be about 1 inch to about 2 inches long, possibly only about 2 mm of the rod may need to be covered to create layered conductive rod 108.

In an alternative method, conductive rod 100 can be covered with the materials using a sputtering technique. Conductive rod 100 may be inserted into a sputtering machine, which deposits the materials onto the rod. Also, conductive rod 100 can be covered using a chemical vapor deposition ("CVD") technique, or any other covering methods that are useful with the type of materials described above.

FIG. 1D illustrates layered conductive rod 108 after these processing steps. Each layer of material is illustrated recessed from the previous layer for illustrative purposes only. However, each successive layer may not need to fully cover the previous layer.

Figure 2C:
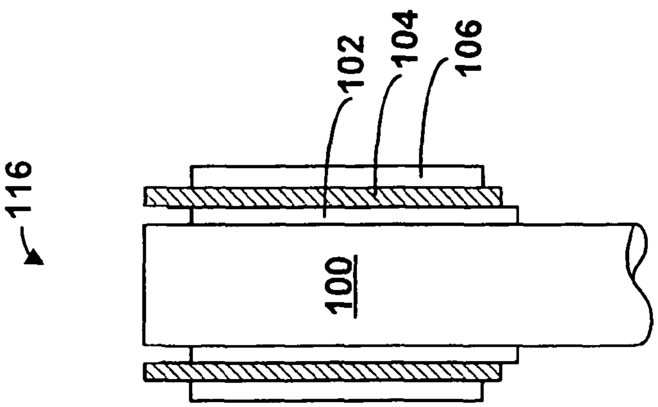
FIGS. 2A-2C illustrate a process of fabricating an electron source according to an exemplary embodiment of the present invention.
Figure 2B:
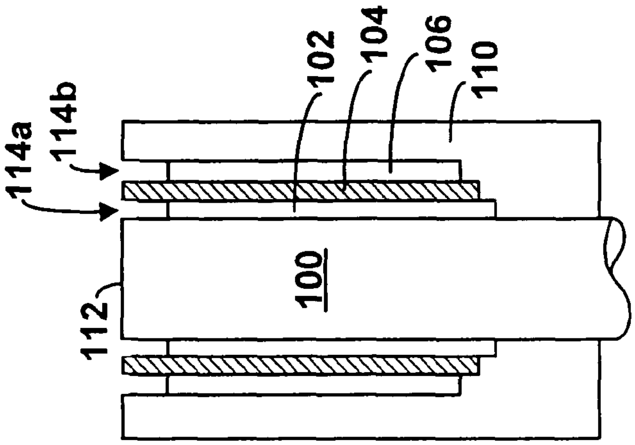
Figure 2A:
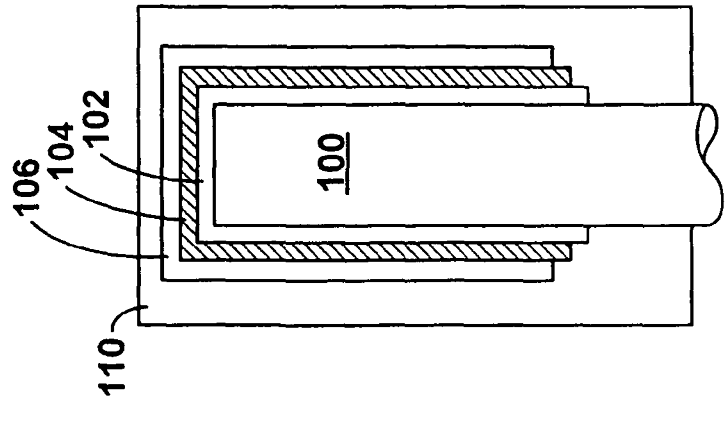

FIGS. 2A-2C illustrate a process of fabricating an electron source 116. Electron source 116 may be fabricated using layered conductive rod 108 illustrated in FIG. 1D. However, other types or designs of layered conductive rods may be used to fabricate electron source 116 as well.

FIG. 2A illustrates conductive rod 100 after it has been covered with first insulating layer 102, field emitter layer 104, and second insulating layer 106. FIG. 2A illustrates covering layered conductive rod 108 with a protective material layer 110. The thickness of protective material layer 110 is not important. Protective material layer 110 simply needs to cover the existing layers on conductive rod 100 so that they will not be disturbed during further processing. Protective material layer 110 may be a photoresist material or any type of resist material that protects some or all of the layers during a polishing step.

Next, as shown in FIG. 2B, the layers of layered conductive rod 108 are removed from a portion of layered conductive rod 108 so that a surface 112 of conductive rod 100 is exposed. Surface 112 may be polished flat. In one embodiment, second insulating layer 106, field emitter layer 104, and first insulating layer 102 are only removed from an end of conductive rod 100 as shown in FIG. 2B. However, the layers may be removed from other areas of conductive rod 100 as well, such as both ends, in order to perform desired applications. As another example, a base and side walls of conductive rod 100 may be covered, and the layers of layered conductive rod 108 may be removed from the base such that the side walls are covered in the proximity of the base (e.g., the layers on the side walls may not be flush with surface 112).

The layers may be removed by a chemical mechanical polishing ("CMP") step, or simply by polishing the layers off surface 112 of conductive rod 100. A mechanical grinding/polishing step can also be used. In addition, a portion of the layered conductive rod may simply be cut off the end of the rod to form exposed surface 112 of conductive rod 100. The depth of the cross-sectional cut may be determined according to a desired application. For example, the layered conductive rod may be cut to be about 1 mm to about 2 mm in length for integration into a catheter (discussed more fully below).

After second insulating layer 106, field emitter layer 104, and first insulating layer 102 are removed from surface 112 of conductive rod 100, first and second insulating layers 102 and 106 may be recessed from surface 112 to create gaps 114*a* and 114*b*, as illustrated in FIG. 2B. First and second insulating layers 102 and 106 may be recessed to any desired depth. For example, the layers may be recessed about 2 μm to about 20 μm from surface 112, depending on the length of conductive rod 100. Recessing first insulating layer 102 may also help to reduce insulator breakdown occurrences and, therefore, lengthen the life of first insulating layer 102.

To utilize the layered conductive rod as an electron source, it may be necessary to have insulating layers 102 and 106 recessed from surface 112, so that they are not flush with surface 112, in order to allow charge carriers to pass from field emitter material 104 to conductive rod 100 through gap 114*a*. Field emitter layer 104 will remain substantially flush with surface 112 of conductive rod 100.

First and second insulating layers 102 and 106 may be recessed by etching a portion of the layers away from surface 112 to create gaps 114*a* and 114*b* using any standard material etching technique.

After first and second insulating layers 102 and 106 have been recessed from surface 112, protective material layer 110 may be removed from layered conductive rod 108 to form the electron source 116, as illustrated in FIG. 2C. However, protective material layer 110 may alternatively be removed prior to etching first and second insulating layers 102 and 106. Protective material layer 110 may be removed by dipping the layered conductive rod into acetone or an appropriate photoresist stripper. Electron source 116 may then be cut to size according to a desired application. It should be understood that the chemical composition of protective material layer 110 should be chosen with care to avoid damage by the resist stripper to the other layers of the electron source 116 when the protective layer 110 is removed.

Figure 3A:
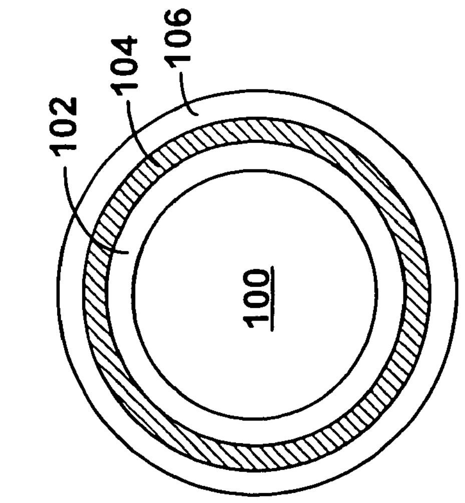
FIGS. 3A-3C illustrate end views of alternate embodiments of the electron source according to the present invention.
Figure 3B:
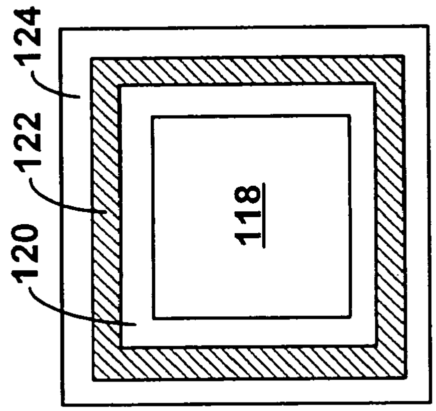
Figure 3C:
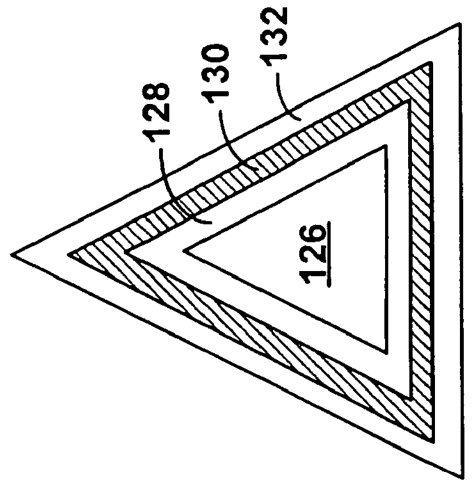

Electron source 116 may have a variety of shapes. The cross-sectional shape of electron source 116 is not important. However, electron source 116 will generally have a length that exceeds its cross-sectional diameter or effective diameter. FIGS. 3A-3C illustrate end views of alternate embodiments of the electron source. FIG. 3A illustrates an end view of electron source 116, as illustrated in FIG. 2C. In this embodiment, conductive rod 100 is cylindrical, and first insulating layer 102, field emitter layer 104, and second insulating layer 106 form rings around conductive rod 100.

FIG. 3B illustrates an end view of an alternative embodiment of electron source 116. A rectangular conductive rod 118, or possibly square rod, is used. Rectangular conductive rod 118 may have a first insulating layer 120, a field emitter layer 122, and a second insulating layer 124 forming squares around rectangular conductive rod 118.

FIG. 3C illustrates an end view of still another alternative embodiment of electron source 116. A triangular conductive rod 126 may be used. Triangular conductive rod 126 may have a first insulating layer 128, a field emitter layer 130, and a second insulating layer 132 forming triangles around triangular conductive rod 126.

FIGS. 3A-3C illustrate different forms of the conductive rod. However, those illustrated are examples only, since any desired form of the conductive rod may be used for a particular application. For example, the conductive rod may also be hollow, and in this example, the inner portion of the conductive rod would need to be protected during the covering processes so that it would remain uncovered.

Figure 4A:
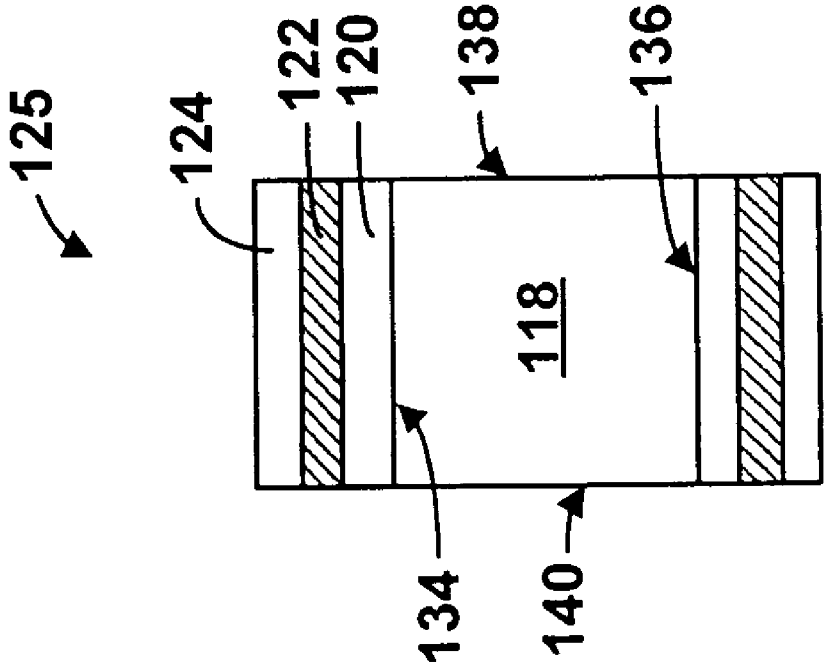
FIGS. 4A-4B illustrate end views of still alternate embodiments of the electron source according to the present invention.
Figure 4B:
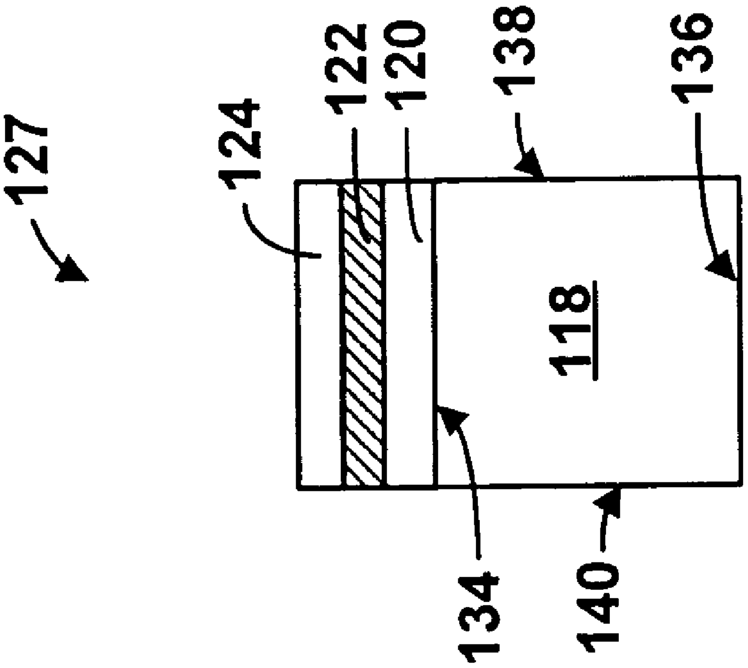

FIGS. 4A-4B illustrate end views of still alternate embodiments of electron source 116. FIG. 4A illustrates an electron source 125 with a rectangular conductive rod 118. However, only two sides, sides 134 and 136, of rectangular conductive rod 118 are covered with first insulating layer 120, field emitter layer 122, and second insulating layer 124. The other two sides, sides 138 and 140, are not covered with these layers. These layers may have been polished off of sides 138 and 140 or covered with resist during processing. FIG. 4B illustrates an electron source 127 with only one side, side 134, covered with first insulating layer 120, field emitter layer 122, and second insulating layer 124. It may be sufficient to have one side of rectangular conductive rod 118, or any form of conductive rod, covered with first insulating layer 120, field emitter layer 122, and second insulating layer 124 to allow for an effective emission of electrons from the field emitter layer (as described below).

Electron source 116 performs or is useful as an electron emitter for diverse applications such as within cathode ray tubes, replacing a thermionic emitter. By using copper as conductive rod 100, heat dissipated at the emission sites of field emitter layer 104 can be readily removed by the copper rod.

Figure 5B:
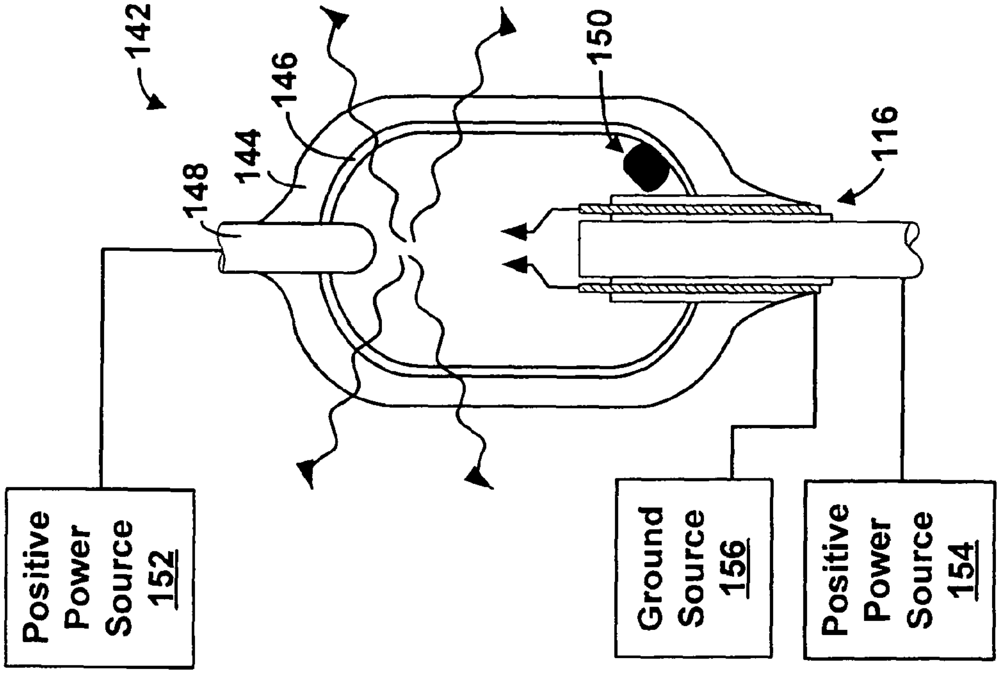
FIGS. 5A-5B illustrate a vacuum tube according to an exemplary embodiment of the present invention.
Figure 5A:
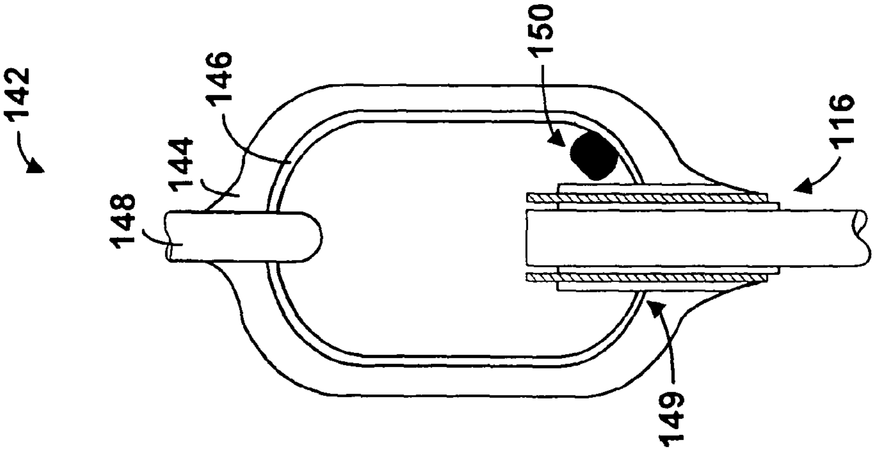

FIGS. 5A-5B illustrate electron source 116 in a vacuum tube configuration. FIG. 5A illustrates a vacuum tube 142. Vacuum tube 142 comprises a housing 144 with electron source 116 inserted in one end and a rod 148 inserted into housing 144 opposite electron source 116. An envelope 146, preferably made of glass, is deposited on the inner portion of the housing 144 and a getter bead 150 is deposited on the inner surface of envelope 146.

Envelope 146 may comprise a fused silica or Schott glass tube with an inner diameter of about 0.5 mm to about 0.7 mm and a length of about 2.5 mm or more. On one end of envelope 146, rod 148 with a conical shaped or semispherical shaped end is sealed into envelope 146. Rod 148 may be made of tungsten, molybdenum, copper, or alloys as well. Rod 148 may be up to about 2.5 mm in length and may have a diameter of up to about 0.5 mm. Standard glass-to-metal sealing techniques can be used to seal the rod into place. For example, if envelope 146 is made of Schott glass, then rod 148 can be first sealed to uranium glass and the uranium glass can then be sealed to the Schott glass envelope using a small Bunsen burner or appropriate micro heater.

On opposite end 149 of envelope 146, electron source 116 is inserted along with getter bead 150, and electron source 116 is sealed to envelope 146, in vacuum for example, by using an appropriate fixture connected to a vacuum pump. The heat generated during the sealing process activates getter bead 150 (which can be placed at any position in the envelope 146, not limited to end 149). Getter bead 150 sorbs gases inside the vacuum envelope 146 that are generated by outgassing events. Getter bead 150 may be any material that can absorb impurities such as water, oxygen, nitrogen, CO, and $CO_2$ particles in envelope 146. Getter bead 150 may comprise zirconium-aluminum (Zr—Al) or zirconium-boron-iron (Zr—B—Fe) alloys, for example.

Housing 144 of vacuum tube 142 may comprise polydimethylsiloxane ("PDMS"), with an appropriate amount of nanoparticles to render it slightly conductive, such as with Vulcan black particles. However, housing 144 may comprise other conductive materials as well. Housing 144 may be about 100 μm to about 300 μm thick and about 1500 μm to about 3000 μm long with an effective diameter of about 500 μm to about 1000 μm for desired applications, such as within a cardiovascular catheter. Envelope 146 including electron source 116 and rod 148 may be inserted into a PDMS solution, to apply housing 144 around envelope 146.

Housing 144 generates a leakage current from rod 148 to electron source 116. For example, at an applied voltage of about 15-20 kV to rod 148, a microampere range leakage current may result. By providing this leakage path, vacuum tube 142 flash over events from rod 148 to electron source 116 are prevented at high voltages.

FIG. 5B illustrates a configuration that may be used to operate vacuum tube 142. A high positive power source 152, such as between about 15-20 kV, is connected and applied to rod 148. A positive power source 154, such as between about 20-150 V, is connected and applied to conductive rod 100 of electron source 116. Also, a ground potential 156 may be applied to field emitter layer 104 of electron source 116.

Figure 6:
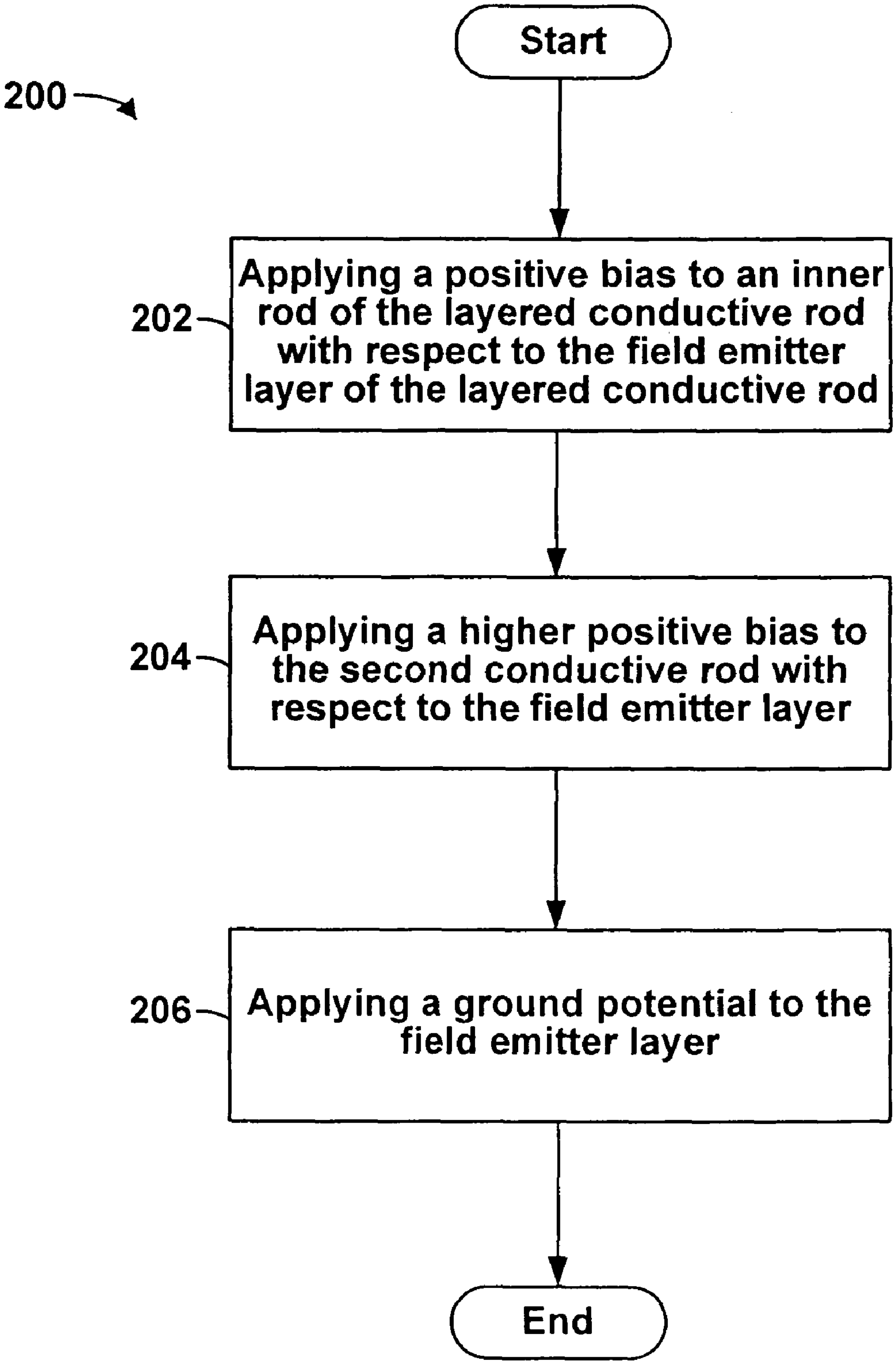
FIG. 6 is a flowchart that depicts one embodiment of a method of operating the vacuum tube.

FIG. 6 is a flowchart that depicts a method 200 of operating vacuum tube 142. As shown at block 202, a positive bias is applied to an inner rod, e.g., conductive rod 100, of the layered conductive rod with respect to field emitter layer 104 of electron source 116 as shown in FIG. 5B. By doing so, electrons are pulled out of field emitter layer 104 via quantum mechanical tunneling. Next, as shown at block 204, a higher positive bias is applied to second conductive rod, e.g., rod 148, with respect to field emitter layer 104. Electrons will thus accelerate to the higher positively charged rod 148 and will generate soft X-rays, also referred to as Bremsstrahlung, as shown by the arrows in FIG. 5B. Rod 148 may absorb some electrons, but some will be converted to X-rays. In addition, a ground potential may be applied to field emitter layer 104, as shown at block 206, to ensure field emitter layer 104 will be less positively biased with respect to conductive rod 100.

In an alternate method, a negative bias may be applied to field emitter layer 104 and a ground potential may be applied to conductive rod 100 in order to pull electrons out of field emitter layer 104. To pull electrons out of field emitter material 104, conductive rod 100 simply needs to have a more positive charge than field emitter material 104. And to accelerate the electrons to rod 148, rod 148 simply needs to have a more positive charge than conductive rod 100.

For more information regarding X-ray radiation due to electron emission, the reader is referred to U.S. Pat. No. 6,477,235, the contents of which are fully incorporated by reference herein.

Figure 7:
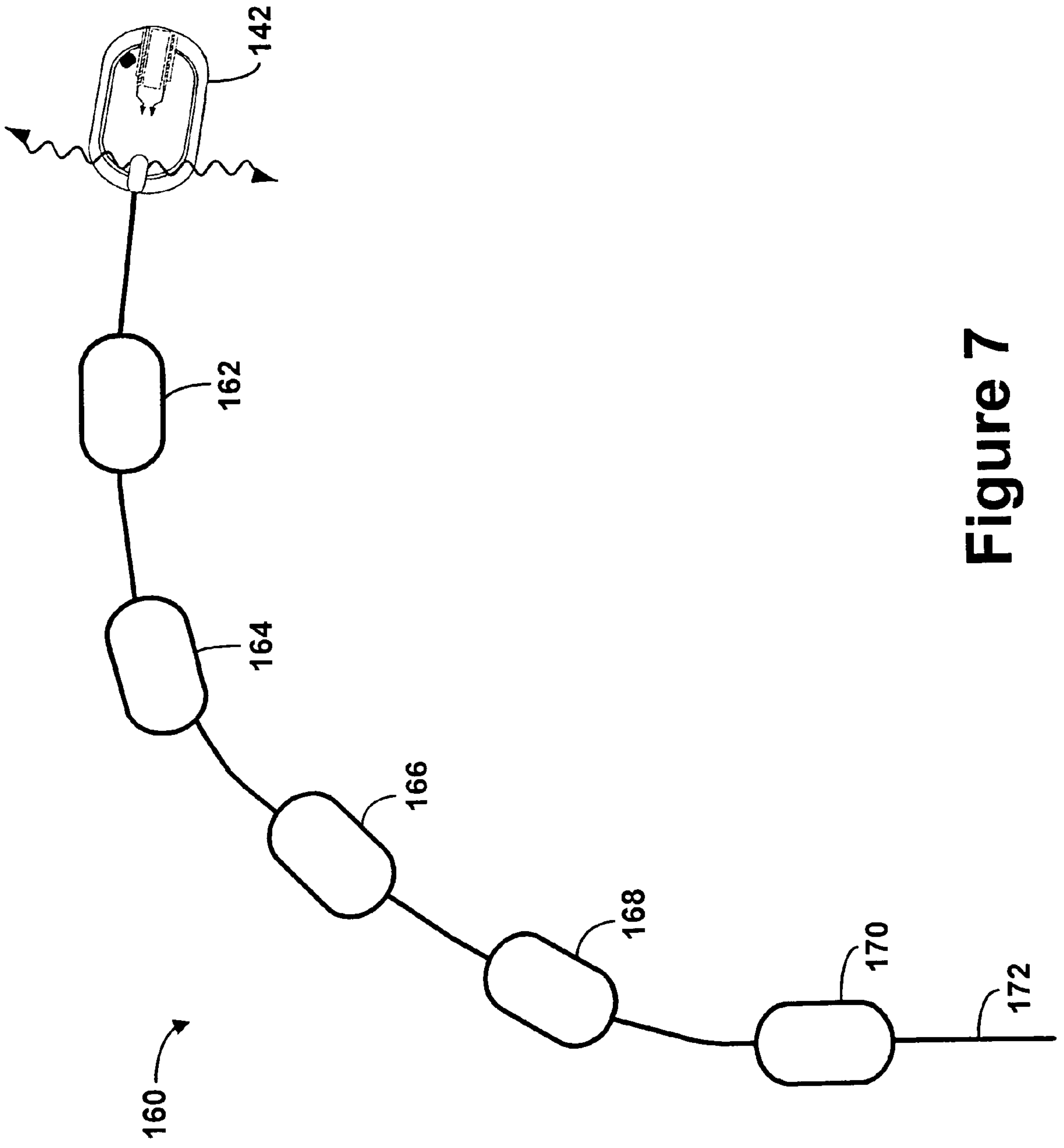
FIG. 7 illustrates one embodiment of an application of a vacuum tube according to the present invention.

FIG. 7 illustrates one of many applications of vacuum tube 142. Here, vacuum tube 142 is integrated into a catheter 160. For this application, vacuum tube 142 comprises a cylindrical inner conductive rod to meet design limitations. Catheter 160 includes voltage up -converters 162, 164, 166, 168, and 170 all coupled through connector 172. Voltage up-converters 162-170 provide the high voltage (about 20 kV) to operate the vacuum tube 142. For example, 3 kV is applied to voltage up-converter 170, which amplifies the voltage to approximately 6 kV. Now, the 6 kV voltage is applied to the input of voltage up -converter 168, which again amplifies the voltage, this time to approximately 9 kV. After three more stages of up-converters the voltage will be approximately 18-20 kV. Voltage up-converters 162 -170 allow for the high voltage vacuum tube 142 to be operated by applying a low voltage to the input of catheter 160. This reduces the risk of injury while vacuum tube 142 is in use. For more information concerning voltage up-converters 162-170, reference is made to commonly owned U.S. patent application Ser. No. 10/190,360, filed on Jul. 3, 2002, the full disclosure of which is incorporated herein by reference.

In the application illustrated in FIG. 7, vacuum tube 142 is used as a small X-ray source at the end of catheter 160, for plaque removal in arteries and veins in mammals, and for cancer treatments. The desired dimensions for electron source 116 of vacuum tube 142 for this application are about 1 mm in diameter and about 2.5 mm long. Vacuum tube 142 should be operated at about 20 kV for therapeutic treatment of clogged cardiac arteries. A cold electron emitter, such as vacuum tube 142, based on field emission is beneficial for such an application since it does not generate heat. This is desirable since blood cannot be heated above 40° C. during treatment. In addition, for vacuum tube 142, only several micro-amps are needed for operation and the duration of the treatment lasts only for several minutes. Furthermore, since vacuum tube 142 is cost efficient and easily manufactured, catheter 160 is disposable.

As another example, electron source 116 may be employed in many applications where thermionic electron emission sources are used, such as within a diode or any electron tube, e.g. cathode ray tube. Electron source 116 may be used in many other applications as well.

While the invention has been described in conjunction with presently preferred embodiments of the invention, persons of skill in the art will appreciate that variations may be made without departure from the scope and spirit of the invention. This true scope and spirit is defined by the appended claims, which may be interpreted in light of the foregoing.

The invention claimed is:

1. A process for fabricating an electron source, consisting essentially of:

(a) covering at least one end of a conductive rod with a first insulating layer, wherein at least one end of the conductive rod further comprises a base and a side wall, (b) covering at least a portion of the first insulating layer with a layer of a field emitter material to form a field emitter layer, (c) covering at least a portion of the field emitter layer with a second insulating layer, (d) covering at least one end of the conductive rod with a layer of a protective material, wherein the protective material is in contact with the second insulating layer, (e) removing the first insulating layer and the field emitter layer from the base of the conductive rod to form a conductive rod having an exposed base and a side wall that is layered in the proximity of the exposed base, (f) removing a portion of the first insulating layer so that the first insulating layer is recessed with respect to the exposed base, and (g) removing at least a portion of the layer of the protective material, wherein step (g) is performed after step (e) and before step (f).

2. The process of claim 1, wherein step (a) comprises covering the base and a perimeter of a side wall adjacent the base.

3. The process of claim 1, wherein steps (a)-(b) comprise at least covering the side wall.

4. The process of claim 1, wherein the first insulating layer comprises a thickness in the range of about 0.5 μm to about 10 μm.

5. The process of claim 1, wherein the field emitter layer comprises a thickness in the range of about 0.1 μm to about 4 μm.

6. The process of claim 1, wherein step (a) comprises dipping at least one end of the conductive rod into an insulating liquid and allowing the conductive rod to cure.

7. The process of claim 1, wherein step (b) comprises dipping at least one end of the conductive rod into a carbon-based solution and allowing the conductive rod to cure.

8. The process of claim 1, wherein steps (a)-(b) comprise a process selected from the group consisting of sputtering and chemical vapor deposition.

9. The process of claim 1, wherein removing is accomplished by a process selected from the group consisting of polishing and grinding.

* * * * *